(12) United States Patent
Behrends et al.

(10) Patent No.: US 8,824,196 B2
(45) Date of Patent: Sep. 2, 2014

(54) SINGLE CYCLE DATA COPY FOR TWO-PORT SRAM

(75) Inventors: Derick G. Behrends, Rochester, MN (US); Todd A. Christensen, Rochester, MN (US); Travis R. Hebig, Rochester, MN (US); Michael Launsbach, Rochester, MN (US); Daniel M. Nelson, Lakeville, MN (US)

(73) Assignee: International Business Machines Corporation, Armonk, NY (US)

( * ) Notice: Subject to any disclaimer, the term of this patent is extended or adjusted under 35 U.S.C. 154(b) by 169 days.

(21) Appl. No.: 13/435,828

(22) Filed: Mar. 30, 2012

(65) Prior Publication Data

US 2013/0258758 A1 Oct. 3, 2013

(51) Int. Cl.
*G11C 11/00* (2006.01)
*G06F 17/50* (2006.01)

(52) U.S. Cl.
USPC ............................. 365/154; 716/119; 716/111

(58) Field of Classification Search
None
See application file for complete search history.

(56) References Cited

U.S. PATENT DOCUMENTS

| | | | |
|---|---|---|---|
| 5,615,160 A | 3/1997 | Phillips et al. | |
| 5,668,761 A * | 9/1997 | Muhich et al. | 365/189.05 |
| 5,729,501 A | 3/1998 | Phillips et al. | |
| 5,854,771 A | 12/1998 | Mori | |
| 6,477,687 B1 | 11/2002 | Thomas | |
| 6,657,886 B1 | 12/2003 | Adams et al. | |
| 7,502,276 B1 | 3/2009 | Behrends et al. | |
| 7,724,586 B2 | 5/2010 | Adams et al. | |
| 2002/0029330 A1 | 3/2002 | Kamano et al. | |
| 2002/0056022 A1 | 5/2002 | Leung | |
| 2002/0196298 A1 * | 12/2002 | Cheng et al. | 347/9 |
| 2003/0043851 A1 | 3/2003 | Wu et al. | |
| 2005/0078126 A1 | 4/2005 | Park et al. | |
| 2006/0143428 A1 | 6/2006 | Noda et al. | |
| 2009/0116324 A1 | 5/2009 | Christensen et al. | |
| 2009/0147945 A1 | 6/2009 | Doi et al. | |
| 2011/0026314 A1 * | 2/2011 | Hamouche et al. | 365/156 |

OTHER PUBLICATIONS

Lekatsas et al., "Design of an One-cycle Decompression Hardware for Performance Increase in Embedded Systems", DAC '02: Proceedings of the 39th annual Design Automation Conference, Jun. 2002, pp. 34-39, Published by ACM, New York, NY, USA. DOI:10.1145/513918.513929.

* cited by examiner

*Primary Examiner* — Hoai V Ho
*Assistant Examiner* — James G Norman
(74) *Attorney, Agent, or Firm* — Richard A. Wilhelm; Robert R. Williams

(57) ABSTRACT

A static random access memory (SRAM) includes a column of SRAM memory cells. The SRAM may include a circuit to copy a value stored in any SRAM memory cell in a column of SRAM memory cells to any SRAM memory cell in the column of SRAM memory cells in a single cycle of the SRAM.

21 Claims, 6 Drawing Sheets

US 8,824,196 B2

SINGLE CYCLE DATA COPY FOR TWO-PORT SRAM

FIELD

This disclosure relates to digital memory circuits, and more specifically, to domino static random access memory circuits.

BACKGROUND

Static random access memory ("SRAM") is a type of volatile memory, i.e., data stored in an SRAM is retained or remains "static" for as long as power is supplied to the memory. A typical SRAM includes an array of memory cells arranged in rows and columns, each cell storing a single bit. Typically, each column and each row includes a large number of memory cells, e.g., columns of 128 memory cells and 128 rows of memory cells. In addition, a typical SRAM includes "word lines" for each row and "bit lines" for each column of the array. A word line is used to enable all of the memory cells in a row for reading or writing. A bit line is used to read or write a bit of data to or from a cell after access to the row has been enabled. Generally, SRAMs are synchronous devices. In other words, read and write operations are synchronized with a reference signal, such as a clock signal.

A "domino SRAM" is a type of SRAM that provides high performance. In a domino SRAM, each column of a memory array is divided into groups, sometimes referred to as "local cell groups." Each local cell group includes a relatively small number of memory cells, e.g., 4 to 16 cells. A column of 128 memory cells may be divided into 8 local cells groups of 16 cells for example. In addition, local evaluation circuits are provided for the local cell groups. The local evaluation circuits include one or more "dynamic" nodes and are coupled with a bit line provided for the column. Data may be read from or written to a particular memory cell using its local evaluation circuit.

SUMMARY

One embodiment is directed to a static random access memory (SRAM) that includes a column of SRAM memory cells. In addition, the SRAM may include a circuit to copy a value stored in any SRAM memory cell in the column of SRAM memory cells to any SRAM memory cell in the column of SRAM memory cells in a single cycle of the SRAM.

In various embodiments, the SRAM may include a local evaluation circuit. In addition, the SRAM may include a local cell group of SRAM memory cells in an embodiment. Further, the SRAM may include a precharge device in an embodiment. Moreover, the SRAM may include a global bit line in one embodiment. In an embodiment, the SRAM may include a gate for a copy signal. In one embodiment, the SRAM may be a domino SRAM.

Additional embodiments are directed to methods and design structures for copying a value stored in any SRAM memory cell in a column of SRAM memory cells to any SRAM memory cell in the column of SRAM memory cells in a single cycle of the SRAM.

BRIEF DESCRIPTION OF THE FIGURES

FIG. 6 is a block diagram of a portion of a domino SRAM according to an embodiment The same numbers may be used in the Figures and the Detailed Description to refer to the same devices, parts, components, steps, operations, and the like.

DETAILED DESCRIPTION

There are a wide variety of applications where it would be beneficial to rapidly read data stored in one memory cell and copy it to another cell in an SRAM. One example is three-dimensional graphics processing, where the speed at which pixel data can be copied from one location in a memory to another location in the memory is a critical factor for good system performance.

Figure 1:
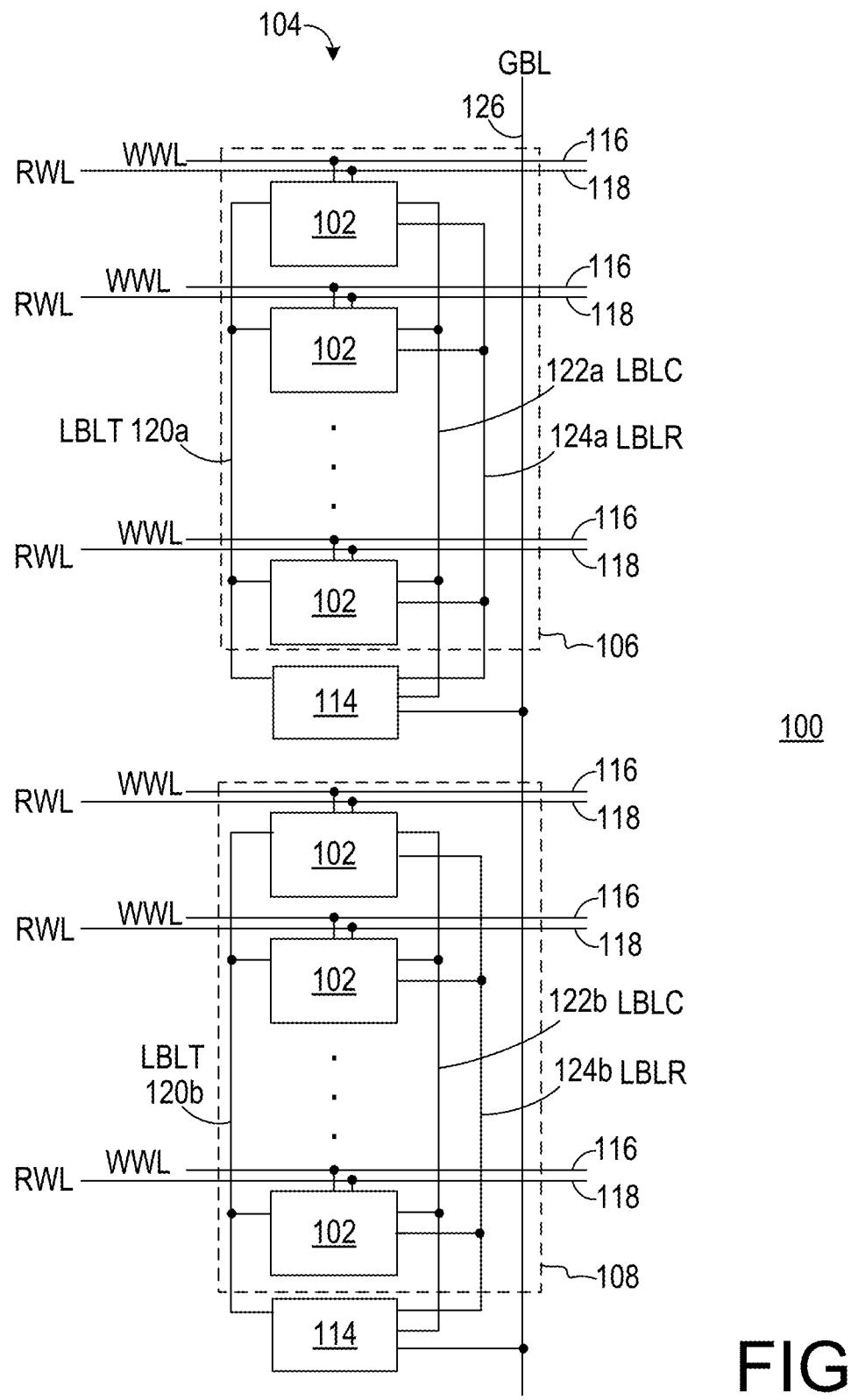
FIG. 1 is a block diagram of a portion of a domino SRAM according to an embodiment.

FIG. 1 is a block diagram of a portion of a domino SRAM 100 according to one embodiment. The domino SRAM 100 may have at least one column of memory cells. In addition, the SRAM 100 may have two or more rows of memory cells. In one embodiment, the SRAM 100 may have 128 columns and 128 rows of memory cells. The SRAM 100 may be a synchronous device. As described below, the domino SRAM 100 is capable of copying data from one memory cell 102 to another memory cell 102 in a single cycle of the SRAM.

FIG. 1 shows a portion of a column 104 of the domino SRAM 100. The shown portion of column 104 includes two local cell groups 106, 108. The local cell groups 106, 108 may include any suitable number of memory cells 102. For example, local cell group may include 4 to 16 memory cells. In some embodiments, a local cell group may include more or fewer memory cells. Typically, a local cell group would not include all of the memory cells 102 in a column 104. In addition, each local cell group typically will include the same number of memory cells. In some embodiments, however, different local cell groups may include different numbers of memory cells.

The portion of a column 104 of the domino SRAM 100 shown in FIG. 1 includes local evaluation modules 114. The domino SRAM 100 may include a local evaluation module 114 for each local cell group.

The domino SRAM 100 may include word lines for enabling access to the memory cells 102. Write word lines (WWL) 116 may be provided for enabling write access to a memory cell. In addition, read word lines (RWL) 118 may be provided for enabling read access from a memory cell. The write word and read word lines 116, 118 may be electrically conductive lines for transmitting signals. A write word line 116 may be provided for each row of memory cells 102 of the domino SRAM 100. In addition, a read word line 118 may be provided for each row of memory cells 102 of the SRAM 100.

The domino SRAM 100 includes bit lines for writing a bit of data to a memory cell 102. A "true local bit line" (LBLT) 120 and a "complement local bit line" (LBLC) 122 may be provided for each local cell group. In the example shown in FIG. 1, the true local bit line 120 is coupled with a true node of each cell 102 in a cell group. In addition, the complement local bit line 122 is coupled with a complement node of each cell 102 in a cell group. A memory cell 102 may store both a data value and its complement, using feedback from the respective values to maintain the state of the cell. When a bit of data is to be written to a memory cell 102, the true local bit line 120 may be used to communicate the data value to the cell, and the complement local bit line 122 may be used to communicate the complement of the data value to the cell. In FIG. 1, the true local bit line for local cell group 106 is designated 120a and the true local bit line for local cell group 108 is designated 120b. Similarly, the complement local bit line for local cell group 106 is designated 122a and the complement local bit line for local cell group 108 is designated 122b. In addition to being coupled with the respective true and complement nodes of the memory cells 102 in a local cell group, the true and complement local bit lines 120 and 122 are coupled with the local evaluation circuit associated with the local cell group. In FIG. 1, true and complement local bit lines 120a and 122a are coupled with the local evaluation circuit 114 associated with local cell group 106. Similarly, the true and complement local bit lines 120b and 122b are coupled with the local evaluation circuit 114 associated with local cell group 108.

The domino SRAM 100 includes bit lines for reading a bit of data from a memory cell 102. A "read local bit line" (LBLR) 124 may be provided for each local cell group. In one embodiment, the read local bit line 124 may be coupled with the complement nodes of each cell 102 in a cell group. In an alternative embodiment, the read local bit line 124 may be coupled with the true nodes of each cell 102 in a cell group. When a bit of data is to be read from a memory cell 102, the value may be output on the read local bit line 124 as further described below. In FIG. 1, the read local bit line for local cell group 106 is designated 124a and the read local bit line for local cell group 108 is designated 124b. In addition to being coupled with the complement nodes of the memory cells in a local cell group, the read local bit line 124a and 124b are coupled with the respective local evaluation circuits 114 associated with local cell groups 106 and 108.

The local evaluation circuits 114 for each column in SRAM 100 may be coupled with a "global bit line" (GBL) 126 associated with the column. For example, in the example of FIG. 1, the local evaluation circuits 114 are coupled with a global bit line 126. The true and complement local bit lines 120 and 122, the read local bit line 124, and the global bit line 126 may be electrically conductive lines for transmitting signals.

The domino SRAM 100 may include control and data lines that are not shown in FIG. 1. Various lines and features have been omitted from FIG. 1 so as to not unnecessarily obscure the shown elements. In one embodiment, the SRAM 100 may include WR_C and WR_T data lines (not shown in FIG. 1) for writing a bit of data to a memory cell 102. The WR_C and WR_T data lines may be coupled with every local evaluation unit in a column of the SRAM 100. In one embodiment, the SRAM 100 may include COPY and WR_EN signal lines (not shown in FIG. 1) for respectively enabling a copy and a write function. The COPY and WR_EN signal lines may be coupled with every local evaluation unit in a row of local evaluation units the SRAM 100. In addition, in one embodiment, the SRAM 100 may include read and write local precharge RLPC and WLPC signal lines (not shown in FIG. 1) for providing a local precharge signal to a local evaluation unit. The read and write local precharge signal lines may be coupled with every local evaluation unit in a row of local evaluation units the SRAM 100. The SRAM 100 may additionally include global precharge GPC signal lines (not shown in FIG. 1) for providing a global precharge signal to a global bit line in one embodiment. In one embodiment, the GPC signal lines may be coupled with every global bit line in the SRAM 100.

In an alternative embodiment, elements of the domino SRAM 100 described herein as being associated with or arranged in a column may be associated with or arranged in a row. Similarly, elements the domino SRAM 100 described herein as being associated with or arranged in a row may be associated with or arranged in a column. For example, in an alternative embodiment, read and write word lines may be associated with columns, global bit lines associated with rows, and local evaluation circuits provided for local cell groups formed from a subset of memory cells of a row. In other words, the words "column" and "row," as used herein, should not be limited to a vertical and horizontal orientation; each term may refer to either orientation.

Figure 2:
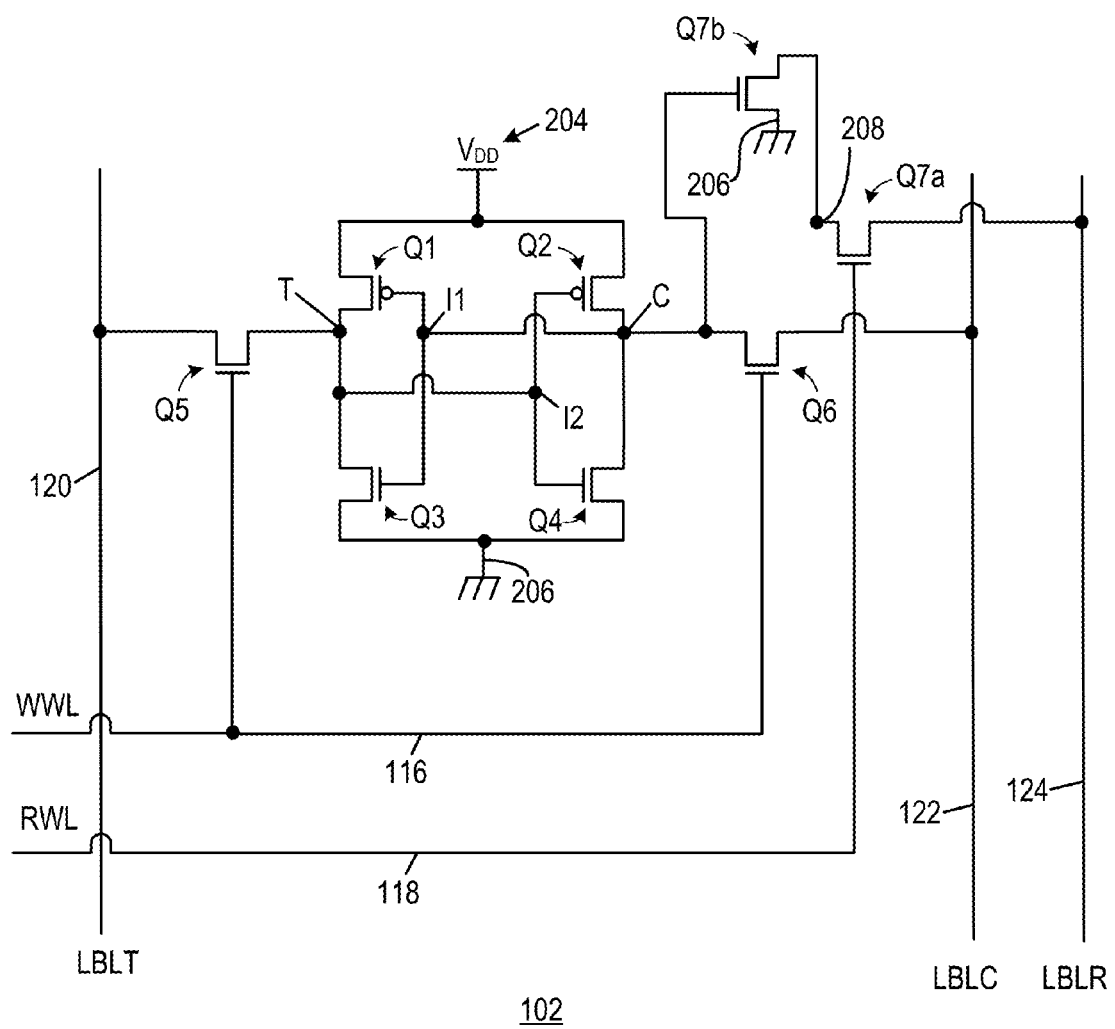
FIG. 2 is a block diagram of an exemplary two-port memory cell according to an embodiment.

FIG. 2 is a block diagram illustrating one example of a two-port memory cell 102. The memory cell 102 includes PMOS transistors Q1 and Q2, and NMOS transistors Q3 and Q4 configured as a latch having cross-coupled inverters. The transistors Q1 and Q3 together form a first inverter, and the transistors Q2 and Q4 together form a second inverter. The output of the first inverter (Q1, Q3) is designated as a "true node" T. The true node T may be defined at the junction of the drain node of PMOS transistor Q1 and the drain node of NMOS transistor Q3. The input of the first inverter is at the gates of transistors Q1 and Q3, designated I1. The output of the second inverter (Q2, Q4) is designated as a "complement node" C. The complement node C may be defined at the junction of the drain node of PMOS transistor Q2 and the drain node of NMOS transistor Q4. The input of the second inverter is at the gates of transistors Q2 and Q4, designated I2.

The output T of the first inverter is coupled with the input I2 of the second inverter. Similarly, the output C of the second inverter is coupled with the input I1 of the first inverter. The cross-coupled inverters provide feedback to maintain the state of the cell. The transistors Q1 and Q2 may be coupled with a voltage source 204, as shown in FIG. 2. Similarly, the transistors Q3 and Q4 may be coupled with a ground 206, as shown.

The memory cell 102 includes pass transistors Q5, Q6, and transistors Q7a and Q7b. The transistors Q5, Q6, Q7a, and Q7b may be NMOS devices. The pass transistor Q5 couples true node T with true local bit line (LBLT) 120. Similarly, the pass transistor Q6 couples complement node C with complement local bit line (LBLC) 122. The gates of pass transistors Q5 and Q6 are driven by write word line (WWL) 116. When a bit of data is to be written to a memory cell 102, the data value is communicated to the cell 102 on the true local bit line 120, and the complement of the data value is communicated to the cell on the complement local bit line 122. The write word line 116 may be asserted to turn on the pass transistors Q5, Q6, allowing the true and complement values to be stored in the cell 102.

The transistor Q7a couples complement node C via transistor Q7b with the read local bit line (LBLR) 124. The gate of transistors Q7a is driven by read word line (RWL) 118. The gate, source, and drain of transistor Q7b are respectively coupled with complement node C, ground, and terminal 208 of transistor Q7a. When a bit of data is to be read from a memory cell 102, the read word line 118 may be asserted to turn on the transistor Q7a, coupling transistor Q7b with the read local bit line (LBLR) 124. The transistor Q7b causes the complement of the value stored on the complement node C to be output on the read local bit line 124. (If a 0 is stored on the complement node C, transistor Q7b will be off and the read local bit line 124 will retain its precharged value of 1. If a 1 is stored on the complement node C, transistor Q7b will be on pulling the read local bit line 124 down to a value of 0.) In an alternative embodiment, the transistors Q7a and Q7b may couple the true node T with the read local bit line 124. In yet another alternative, the transistors Q7a and Q7b may be replaced with two pairs of transistors and the read local bit line 124 may be replaced with a two read local bit lines, one pair of transistors for coupling the true node with a first read local bit line and the other pair of transistors for coupling the complement node with a second read local bit line.

Figure 3:
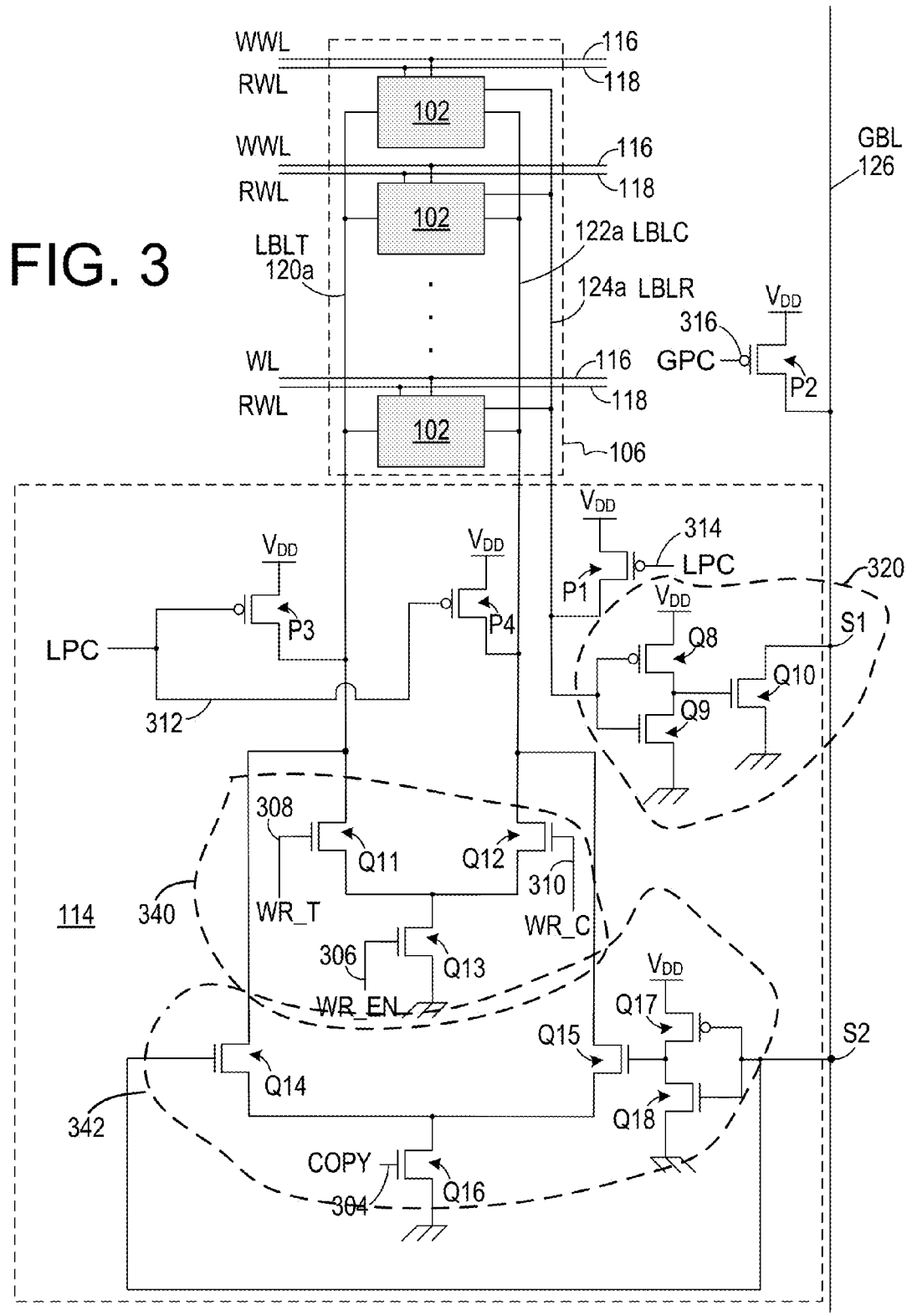
FIG. 3 is a block diagram of an exemplary local evaluation circuit according to an embodiment.

FIG. 3 illustrates one example of a local evaluation circuit 114. The local evaluation circuit 114 provides two alternative capabilities for storing data in a memory cell 102 and a capability for reading data from a cell: (a) writing data to a memory cell 102; (b) copying data to a memory cell 102; and (c) reading data from a memory cell 102. The writing mode (a) stores data in a memory cell that may be received by the SRAM 100 from a source outside the SRAM. In contrast, the copying mode (b) stores data in a memory cell that may be stored within any memory cell of the same column of the SRAM 100. The read operation reads data from a memory cell 102 and places the data on the global bit line 126. The copy operation and the read operation may be performed together in a single cycle of the SRAM.

The local evaluation circuit 114 is coupled with each memory cell 102 of local cell group 106 via the true and complement local bit lines 120a, 122a. In addition, the local evaluation circuit 114 is coupled with the complement nodes of each memory cell 102 of local cell group 106 via read local bit line 124a. The read local bit line 124a may serve as a domino node. In an alternative embodiment, the read local bit line 124a may be coupled with the true nodes of the memory cells 102. One of ordinary skill in the art will understand the appropriate modifications required to account for the difference in polarity in an embodiment in which the read local bit line 124a is coupled with the true nodes.

A local evaluation circuit 114 may be coupled with memory cells 102 of the column 104 other than those in the cell group with which it is associated via the global bit line 126. Specifically, a particular local evaluation circuit 114 may be coupled with other local evaluation circuits 114 of the column 104 via the global bit line 126. For example, the local evaluation circuit 114 associated with local cell group 106 may be coupled with the local evaluation circuit 114 associated with local cell group 108 via the global bit line 126, as shown in FIG. 1. As explained below, the local evaluation circuit 114 may be coupled with the global bit line 126, shown for clarity in FIG. 3 as being coupled at two points S1 and S2.

Referring to FIG. 3, the local evaluation circuit 114 may be coupled with lines providing data and control signals. In the write mode, i.e., when data is written from a source outside the SRAM 100, the value of the data bit to be stored in a memory cell 102 may be presented on line 308 as a write true signal (WR_T). The complement of the data bit to be stored in a memory cell may be presented on line 310 as a write complement signal (WR_C). A write enable signal (WR_EN) may be presented on the line 306 to enable the local evaluation circuit 114 in the write mode.

Further, in the copy mode, i.e., when data is copied from any memory cell within the SRAM 100 to any memory cell in the same column of the SRAM 100, the local evaluation circuit 114 may be coupled with lines providing a data and a control signal. The local evaluation circuit 114 may be coupled with the global bit line 126 at point S2. A data value to be stored in a memory cell 102 in copy mode may be presented on the global bit line 126. A copy enable signal (COPY) may be presented on the line 304 to enable the local evaluation circuit 114 in the copy mode.

The local evaluation circuit 114 may include three precharge devices. In addition, a precharge device may be provided for the global bit line 126. In one embodiment, a precharge device may be formed from a PMOS transistor having its source coupled to a voltage supply, its drain coupled with a bit line, and its gate couple with a precharge signal. In one alternative, a precharge device may be formed from an NMOS transistor. The local evaluation circuit 114 may include a precharge device P1 that has its drain coupled with the read local bit line 124a and its gate coupled with read local precharge (RLPC) line 314. In addition, a precharge device P2 for the global bit line 126 may have its drain coupled with the global bit line 126 and its gate coupled with line global precharge (GPC) line 316. Further, the local evaluation circuit 114 may include precharge devices P3 and P4 that have their respective drains coupled with the true and complement local bit line 120a and 122a, and their gates coupled with write local precharge (WLPC) line 312. Read and write local precharge signals (RLPC, WLPC) may be presented on lines 312 and 314, respectively. In addition, a global precharge signal (GPC) may be presented on line 316. In one embodiment, the read local precharge (RLPC) may be a copy of the write local precharge (WLPC), or visa versa. In one embodiment, the global precharge signal may be a copy of the read or write local precharge signals. Alternatively, the global precharge signal may be a delayed copy of the read or write local precharge signals.

The local evaluation circuit 114 may include a read bit line circuit 320 for communicating a data value stored in memory cell 102 to the global bit line 126. In one embodiment, the read bit line circuit 320 includes transistors Q8, Q9, and Q10. The PMOS transistor Q8 and NMOS transistor Q9 together form an inverter having the read local bit line 124a as an input. The output of this inverter is coupled with the gate of NMOS transistor Q10. The drain of Q10 is coupled with global bit line 126. The source of Q10 is coupled with ground.

In one alternative, the read bit line circuit 320 may be shared by two local evaluation circuits. In this alternative, a two-input NAND gate may be substituted for the inverter (Q8, Q9). In this embodiment, one input of the NAND gate may be coupled with the read local bit line of a first local cell group and the other input may be coupled with a read local bit line of a second local cell group. For example, one input of the NAND gate may be coupled with read local bit line 124a and the other input may be coupled with a read local bit line 124b.

The local evaluation circuit 114 may include a copy bit line circuit 342 for copying data into a memory cell 102 from another memory cell in the same column of SRAM 100. In one embodiment, the copy bit line circuit 342 may include the transistors Q14, Q15, Q16, Q17, and Q18. The transistors Q14, Q15, Q16, and Q18 may be NMOS devices. The transistor Q17 may be a PMOS device. The PMOS transistor Q17 and NMOS transistor Q18 together form an inverter having an input coupled with the global bit line 126 at point S2, and an output coupled with the gate of transistor Q14. Thus, the gate of transistor Q14 may receive an inverted version of a data signal present on the global bit line 126. In a complementary manner, the gate of transistor Q15 is coupled with the global bit line 126. It can be seen that the gate of transistor Q15 may receive a true version of a data signal present on the global bit line 126. The source nodes of transistors Q14 and Q15 may be coupled with the drain of transistor Q16, which may serve to enable the copy mode of operation. The gate and source of transistor Q16 may be respectively coupled with a copy signal (COPY) on line 304 and ground. The copy signal thus serves to enable a copy operation.

The local evaluation circuit 114 may include a write bit line circuit 340 for writing data into a memory cell 102 from a source outside the SRAM 100. In one embodiment, the write bit line circuit 340 may include the transistors Q11, Q12, and Q13. The transistors Q11, Q12, and Q13 may be NMOS devices. The drain nodes of transistors Q11 and Q12 may be respectively coupled with the true local bit line 120a and the complement local bit line 122a. The gate of transistor Q11 may be coupled with line 310, on which a write complement data signal (WR_C) may be provided. The gate of transistor Q12 may be coupled with line 308, on which a write true data signal (WR_T) may be provided. The source nodes of transistors Q11 and Q12 may be coupled with the drain of transistor Q13, which may serve to enable the write mode of operation. The source of transistor Q13 may be coupled with ground. The gate of transistor Q13 may be coupled with a write enable signal (WR_EN) on line 306, which may serve to enable a write operation.

Figure 4:
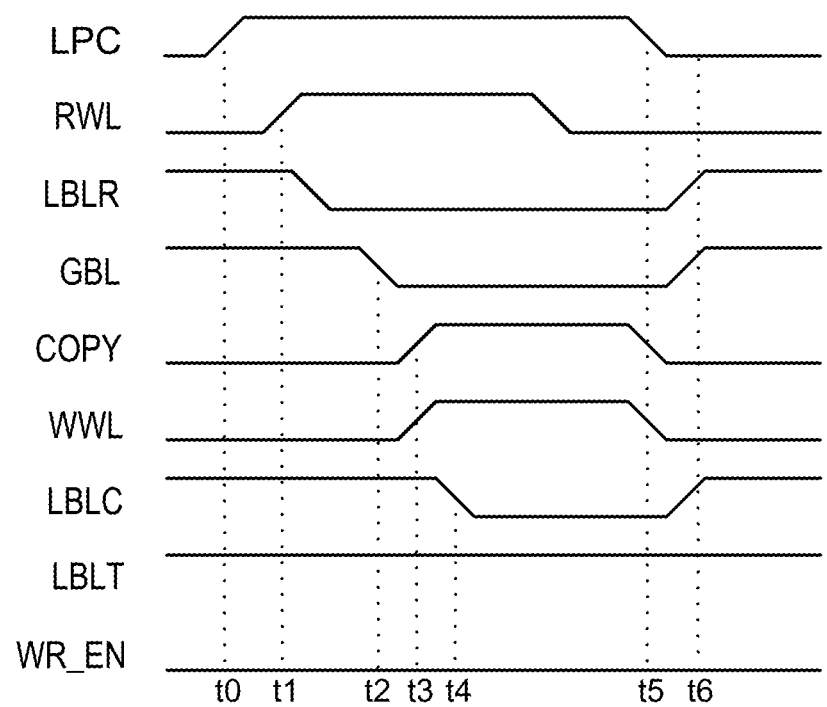
FIG. 4 is an exemplary timing diagram illustrating operation of the exemplary local evaluation circuit of FIG. 3 according to an embodiment.

FIG. 4 is an exemplary timing diagram illustrating operation of the local evaluation circuit 114. The copy and read operations may be performed together in a single cycle of the SRAM 100. Referring now to FIGS. 3 and 4, a single cycle copy and read operation in accordance with an embodiment is next described. In this description, it is initially assumed that the state of a memory cell 102 that is to be read is 1 prior to the copy and read operation, i.e., the true node T is a logic 1 and the complement node C is a logic 0.

The single cycle read and copy operation starts with the de-assertion of the read and write local precharge signals (RLPC, WLPC), and the global precharge signals (GPC) on lines 312, 314, and 316 at time t0. As mentioned, the read and write local precharge signals and the global precharge signal may all be copies of the same signal and, for this reason, only a local precharge signal (LPC) is shown in FIG. 4. In other words, the local precharge signal (LPC) collectively refers to RLPC, WLPC, and GPC in FIG. 4. Prior to de-assertion of the precharge signals, the precharge devices P1, P2, P3, and P4 are turned on, resulting in a charge being present on each of the true and complement local bit lines (LBLT, LBLC) 120a, 122a, the local read bit line (LBLR) 124a, and the global bit line (GBL) 126 at time t0. Accordingly, LBLR, GBL, LBLC, and LBLT are high at the start of a cycle. The de-assertion of the local and global precharge signals turns off precharge devices P1, P2, P3, and P4.

The read word line (RWL) 118 associated with a memory cell 102 that is to be read transitions high at time t1, activating the transistor Q7a (FIG. 2). Since the complement node is assumed to be 0, the high state on the read local bit line (LBLR) 124 remains substantially unchanged at time t1. (On the other hand, if it is assumed that a 1 is stored on the complement node C, LBLR would begin discharging shortly after time t1.) Because the LBLR 124 remains high, transistor Q9 stays on and holds the input to gate Q10 low. This allows the Global bit line (GBL) 126 to remain high. (On the other hand, if it is assumed that a 1 is stored on the complement node C, transistor Q9 would turn off, Q8 would turn on pulling the gate of Q10 high which would pull the global bit line 126 low. In the case of a 1 being stored on node C, the global bit line 126 would go low at time t2 in FIG. 4.)

Because transistor Q10 turns off, the global bit line (GBL) 126 remains high. (On the other hand, if it is assumed that a 1 is stored on the complement node C, transistor Q10 would turn on discharging GBL, pulling the global bit line 126 low. In the case of a 1 being stored on node C, the global bit line 126 would go low at time t2 in FIG. 4).

Still referring to FIG. 4, the copy enable signal (COPY) on line 304 is asserted at time t3. Assertion of the copy signal enables the copy aspect of the single cycle read and copy operation. In addition, the write word line (WWL) signal associated with the memory cell 102 that the data is to be copied to transitions high at time t3. Assertion of the write word line signal activates the pass transistors Q5 and Q6 (FIG. 2) associated with the cell that the data is to be copied to.

It should be noted that during a copy operation, the write enable (WR_EN) signal on line 306 is held low, disabling transistors Q11 and Q12 and the write mode of operation.

The 1 present on the global bit line 126 causes the inverter formed from transistors Q17 and Q18 to output a 0, turning off transistor Q14. In contrast, the 1 present on the global bit line 126 is coupled with the gate of transistor Q15, turning transistor Q15 on. Since both the true and complement local bit lines (LBLT, LBLC) 120a and 122a are precharged high, the true local bit line 120a stays high and the complement local bit line 122a discharges. As shown in FIG. 4, the complement local bit line 122a discharges at time t4. As a result, a 1 is placed on the true node T and a 0 is placed on complement node C of the memory cell 102 to which the data is being copied.

The local and global precharge signals (RLPC, WLPC, GPC) on lines 312, 314, and 316 may be asserted at time t5. The read word line signal (RWL) may be de-asserted at an appropriate time, such as after a data value has been communicated to the global bit line. The write word line (WWL) may be de-asserted at an appropriate time, such as after a data value and its complement have been placed on the true and complement nodes. In addition, the copy enable signal (COPY) may be de-asserted after data has been copied.

The single cycle read and copy operation may conclude at time t6. As described above, the single cycle read and copy operation may start at time t0 with the de-assertion of the local and global precharge signals and may conclude at time t6, which follows the assertion of the local and global precharge signals by a period of time sufficient to precharge bit lines for a next SRAM cycle. The local and global precharge signals may define a cycle of SRAM 100 according to one embodiment.

In a single cycle read and copy operation, the memory cell 102 from which data is copied may be any memory cell in the same local cell group as the memory cell receiving the copied data. However, this is not required, and the memory cell 102 from which data is copied may be any memory cell in the same column serviced by the global bit line 126 of the SRAM 100. Similarly, data may be copied to any memory cell 102 in the local cell group of the memory cell 102 from which data is read, or data may be copied to any other memory cell 102 in any local cell group of the same column of the SRAM 100.

In the above description of a single cycle read and copy operation, prior to the read operation, the state of the memory cell 102 to be read prior to the read operation is assumed to be 1 (i.e., true node at 1, complement node at 0). If, on the other hand, prior to the read operation, the state of the memory cell 102 to be read prior to the read operation is assumed to be 0, a similar process occurs: In a read phase of the single cycle operation, a 1 on the complement node of a memory cell 102 results in the placement of a 0 on the global bit line 126. In addition, in a copy phase of the single cycle operation, a 0 on the global bit line 126 results in a 1 on the complement local bit line 122 and a 0 on the true local bit line 120.

In one alternative, two transistors, e.g., Q16A and Q16B, may be substituted for the transistor Q16. The drain of Q16A may be coupled with the source of transistor Q14. The drain of Q16B may be coupled with the source of transistor Q15. The gates of both Q16A and Q16B may be coupled with the copy signal and their sources at ground.

In yet another alternative, two transistors, e.g., Q13A and Q13B, may be substituted for the transistor Q13. The drain of Q13A may be coupled with the source of transistor Q11. The drain of Q13B may be coupled with the source of transistor Q12. The gates of both Q13A and Q13B may be coupled with the write enable signal and their sources at ground.

Figure 6:
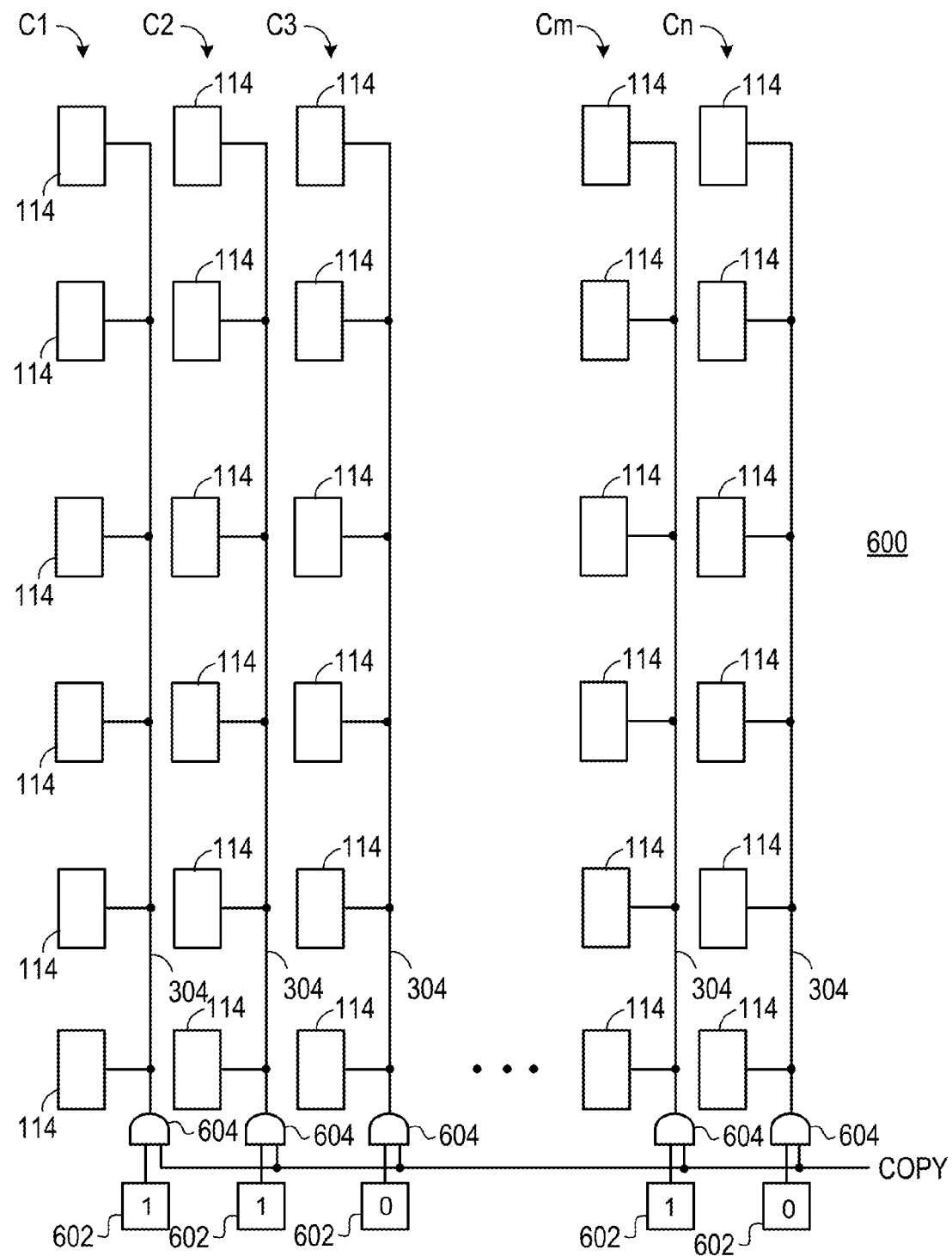

FIG. 6 illustrates an alternative embodiment in which a distinct copy signal may be provided to distinct columns. In one embodiment, the COPY signal may be a global signal provided to all columns of an SRAM 100, i.e., the same signal may be provided to all local evaluation units 114. In an alternative embodiment, however, as shown in FIG. 6, a distinct COPY signal may be provided to distinct columns of the SRAM 100. This alternative may be used to implement bit masking.

FIG. 6 is a block diagram illustrating five columns C1, C2, C3, Cm, and Cn of an SRAM 600 having a plurality of columns. Each column may include a plurality of memory cells 102 (not shown) and a plurality of local evaluation units 114, in this example six local evaluation units 114. The SRAM 600 includes a signal line 304 for each column of the SRAM 600 for communicating a COPY signal. In one embodiment, a two-input AND gate 604 may be provided for each column. The output of each AND gate 604 is the signal line 304 for an associated column. One input of each AND gate 604 may be coupled with the copy signal. The second input of each AND gate 604 may be coupled with a register 602 for storing a mask bit. The register 602 may include two or more register locations for storing a single bit. One register location may be provided for each column. Storing a 1 in the register 602 for a particular column allows the COPY signal to reach the column. Storing a 0 in the register 602 for a particular column blocks the COPY signal from reaching the column. An AND gate 604 and a register location in the register 602 may together form a COPY signal gate for a column. In the example shown in FIG. 6, register locations 602-3 and 602-m store a 0 so that the bits of rows corresponding with columns C3 and Cm are masked during a single cycle copy operation.

Figure 5:
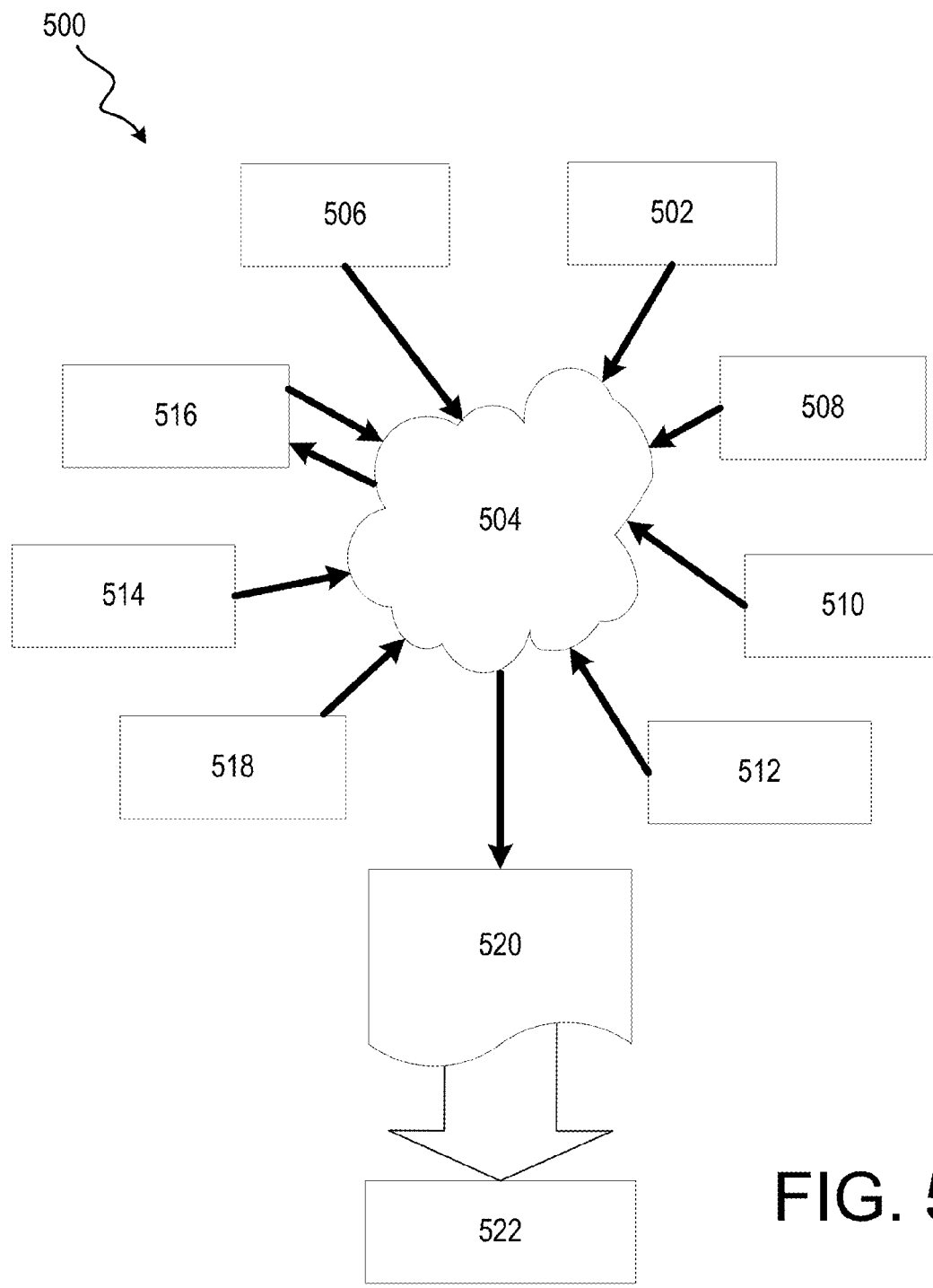
FIG. 5 is a flow diagram of a design process used in semiconductor design, manufacturing, or testing according to an embodiment.

FIG. 5 shows a block diagram of an example design flow 500. Design flow 500 may vary depending on the type of IC being designed. For example, a design flow 500 for building an application specific IC (ASIC) may differ from a design flow 500 for designing a standard component. Design structure 502 is preferably an input to a design process 504 and may come from an IP provider, a core developer, or other design company or may be generated by the operator of the design flow, or from other sources. Design structure 502 comprises single cycle read and copy operation, or all or a portion of SRAM 100, in the form of schematics or HDL, a hardware-description language, for example, Verilog, VHDL, C, and the like. Design structure 502 is tangibly contained on, for example, one or more machine readable storage medium. For example, design structure 502 may be a text file or a graphical representation of local evaluation module 114 or SRAM 100. Design process 504 preferably synthesizes, or translates, local evaluation module 114 or SRAM 100 into a netlist 506, where netlist 506 is, for example, a list of wires, transistors, logic gates, control circuits, I/O, models, etc. that describes the connections to other elements and circuits in an integrated circuit design and recorded on at least one of machine readable storage medium. This may be an iterative process in which netlist 506 is resynthesized one or more times depending on design specifications and parameters for the circuit.

Design process 504 may include using a variety of inputs; for example, inputs from library elements 508 which may house a set of commonly used elements, circuits, and devices, including models, layouts, and symbolic representations, for a given manufacturing technology, such as different technology nodes, 32 nm, 45 nm, 90 nm, and the like, design specifications 510, characterization data 512, verification data 514, design rules 516, and test data files 518, which may include test patterns and other testing information. Design process 504 may further include, for example, standard circuit design processes such as timing analysis, verification, design rule checking, place and route operations, and the like. One of ordinary skill in the art of integrated circuit design can appreciate the extent of possible electronic design automation tools and applications used in design process 504 without deviating from the scope and spirit of the invention. The design structure of the invention is not limited to any specific design flow.

Design process 504 preferably translates an embodiment of the invention as shown in FIGS. 1-3 along with any additional integrated circuit design or data (if applicable), into a second design structure 520. Design structure 520 resides on a machine readable storage medium in a data format used for the exchange of layout data of integrated circuits, for example, information stored in a GDSII (GDS2), GL1, OASIS, or any other suitable format for storing such design structures. Design structure 520 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1-3. Design structure 520 may then proceed to a stage 522 where, for example, design structure 520 proceeds to tape-out, is released to manufacturing, is released to a mask house, is sent to another design house, is sent back to the customer, and the like.

While the present invention has been described with reference to the details of the embodiments of the invention shown in the drawings, these details are not intended to limit the scope of the invention as claimed in the appended claims.

What is claimed is:

1. A static random access memory (SRAM) comprising:
a column of SRAM memory cells having a global bit line to receive data from a SRAM memory cell of the column and a plurality of local cell groups,
each local cell group having a copy bit line circuit, a local read bit line, and a local bit line to store data in a SRAM memory cell of the local cell group,
the copy bit line circuit having an input coupled with the global bit line and an output coupled with the local bit line,
the local read bit line coupled with the global bit line;
wherein a value stored in any SRAM memory cell of a first local cell group is copied to any SRAM memory cell of a second local cell group in a single cycle of the SRAM via a local read bit line of the first local cell group, the global bit line, and a copy bit line circuit and a local bit line of the second local cell group.

2. The SRAM of claim 1, further comprising a device to selectably couple a SRAM memory cell of the local cell group with the local read bit line, wherein the device selectably couples the SRAM memory cell of the local cell group with the local read bit line in response to receipt of a read word line signal by the device.

3. The SRAM of claim 1, further comprising a device to selectably couple a SRAM memory cell of the local cell group with the local bit line, wherein the device selectably couples the SRAM memory cell of the local cell group with the local bit line in response to receipt of a write word line signal by the device.

4. The SRAM of claim 1, further comprising a precharge device.

5. The SRAM of claim 1, wherein the first local cell group and the second local cell group are the same local cell group.

6. The SRAM of claim 1, wherein the copy bit line circuit includes a copy signal gate to selectably couple the global bit line with the local bit line, and wherein the copy signal gate selectably couples the global bit line with the local bit line in response to a copy enable signal.

7. The SRAM of claim 1, wherein the SRAM is a domino SRAM.

8. The SRAM of claim 1, wherein a value stored in a first SRAM memory cell of the first local cell group is copied to the first SRAM memory cell of the first local cell group.

9. A method for copying a value from any static random access memory (SRAM) cell in a column of SRAM cells to any SRAM cell, the column having a global bit line to receive data from a SRAM memory cell of the column and a plurality of local cell groups, each local cell group having a copy bit line circuit, a local read bit line, and a local bit line to store data in a SRAM memory cell of the local cell group, the copy bit line circuit having an input coupled with the global bit line and an output coupled with the local bit line, the local read bit line being coupled with the global bit line, comprising:
 selecting a first SRAM memory cell in the column of SRAM memory cells;
 selecting a second SRAM memory cell in the column of SRAM memory cells; and
 copying a value stored in the first SRAM memory cell to the second SRAM memory cell via the global bit line in a single cycle of the SRAM.

10. The method of claim 9, wherein the column of SRAM cells includes first and second local cell groups, and the first memory cell is in the first local cell group and the second memory cell is in the second local cell group.

11. The method of claim 9, wherein the column of SRAM cells includes a first local cell group, and the first memory cell and the second memory cell are in the first local cell group.

12. The method of claim 9, wherein the second SRAM memory cell and the first SRAM memory cell are the same SRAM memory cell.

13. The method of claim 9, wherein the SRAM is a domino SRAM.

14. A design structure tangibly embodied in a non-transitory machine readable storage medium used in a design process, the design structure comprising hardware description language instructions specifying:
 a static random access memory (SRAM) including a column of SRAM cells, the column having a global bit line to receive data from a SRAM memory cell of the column and a plurality of local cell groups, each local cell group having a copy bit line circuit, a local read bit line, and a local bit line to store data in a SRAM memory cell of the local cell group, the copy bit line circuit having an input coupled with the global bit line and an output coupled with the local bit line, the local read bit line being coupled with the global bit line;
 wherein a value stored in any SRAM memory cell of a first local cell group is copied to any SRAM memory cell of a second local cell group in a single cycle of the SRAM via a local read bit line of the first local cell group, the global bit line, and a copy bit line circuit and a local bit line of the second local cell group; and
 wherein the instructions, when executed by a processor simulate operation of the SRAM.

15. The design structure of claim 14, wherein a value stored in a first SRAM memory cell of the first local cell group is copied to the first SRAM memory cell of the first local cell group.

16. The design structure of claim 14, wherein the SRAM includes a a device to selectably couple a SRAM memory cell of the local cell group with the local read bit line, wherein the device selectably couples the SRAM memory cell of the local cell group with the local read bit line in response to receipt of a read word line signal by the device.

17. The design structure of claim 14, wherein the SRAM includes a device to selectably couple a SRAM memory cell of the local cell group with the local bit line, wherein the device selectably couples the SRAM memory cell of the local cell group with the local bit line in response to receipt of a write word line signal by the device.

18. The design structure of claim 14, wherein the SRAM includes a precharge device.

19. The design structure of claim 14, wherein the first local cell group and the second local cell group are the same local cell group.

20. The design structure of claim 14, wherein the copy bit line circuit includes a copy signal gate to selectably couple the global bit line with the local bit line, and wherein the copy signal gate selectably couples the global bit line with the local bit line in response to a copy enable signal.

21. The design structure of claim 14, wherein the SRAM is a domino SRAM.

* * * * *